US009552863B1

(12) United States Patent
Andre et al.

(10) Patent No.: US 9,552,863 B1
(45) Date of Patent: Jan. 24, 2017

(54) MEMORY DEVICE WITH SAMPLED RESISTANCE CONTROLLED WRITE VOLTAGES

(71) Applicant: Everspin Technologies, Inc., Chandler, AZ (US)

(72) Inventors: Thomas Andre, Austin, TX (US); Syed Alam, Austin, TX (US); Chitra K. Subramanian, Mahopac, NY (US); Dietmar Gogl, Austin, TX (US)

(73) Assignee: Everspin Technologies, Inc., Chandler, AZ (US)

(*) Notice: Subject to any disclaimer, the term of this patent is extended or adjusted under 35 U.S.C. 154(b) by 0 days.

(21) Appl. No.: 14/872,438

(22) Filed: Oct. 1, 2015

Related U.S. Application Data

(60) Provisional application No. 62/058,539, filed on Oct. 1, 2014.

(51) Int. Cl.
G11C 11/00 (2006.01)
G11C 11/16 (2006.01)
G11C 13/00 (2006.01)
G11C 11/14 (2006.01)
G11C 11/15 (2006.01)

(52) U.S. Cl.
CPC ............ G11C 11/1675 (2013.01); G11C 11/14 (2013.01); G11C 11/15 (2013.01); G11C 11/16 (2013.01); G11C 13/0002 (2013.01)

(58) Field of Classification Search
CPC .................. G11C 11/14–11/16; G11C 13/0002
USPC .......................... 365/148, 163, 158, 171, 173
See application file for complete search history.

(56) References Cited

U.S. PATENT DOCUMENTS

2012/0069633 A1* 3/2012 Katoh .................. G11C 13/004
365/148
2012/0140566 A1* 6/2012 Aritome .............. G11C 11/5628
365/185.19
2014/0219014 A1* 8/2014 Lee ......................... G11C 11/56
365/163

* cited by examiner

Primary Examiner — Han Yang
(74) Attorney, Agent, or Firm — Lee & Hayes, PLLC

(57) ABSTRACT

A memory device is configured to identify a set of bit cells to be changed from a first state to a second state. In some examples, the memory device may apply a first voltage to the set of bit cells to change a least a first portion of the set of bit cells to the second state. In some cases, the memory device may also identify a second portion of the bit cells that remained in the first state following the application of the first voltage. In these cases, the memory device may apply a second voltage having a greater magnitude, duration, or both to the second portion of the set of bit cells in order to set the second portion of bit cells to the second state.

20 Claims, 6 Drawing Sheets

MEMORY DEVICE WITH SAMPLED RESISTANCE CONTROLLED WRITE VOLTAGES

RELATED APPLICATION

This application claims priority to U.S. Provisional Application No. 61/058,539 to Andre et al., entitled "Write Voltage control Using Sampled Resistance," filed Oct. 1, 2014, the contents of which are incorporated herein by reference in their entirety.

BACKGROUND

In magnetic memory devices, such as magnetic random access memory (MRAM) devices, the energy consumption rate of an MRAM may be higher than comparable non-magnetic memory devices, such as dynamic random access memory (DRAM) devices. Likewise, the reliability rate of an MRAM device may be lower than a comparable DRAM devices and other non-magnetic memory devices. In some instances, the high energy consumption rate and lower reliability rate of MRAM devices are related to the higher voltage and/or current required to read and write data bits associated with the MRAM devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
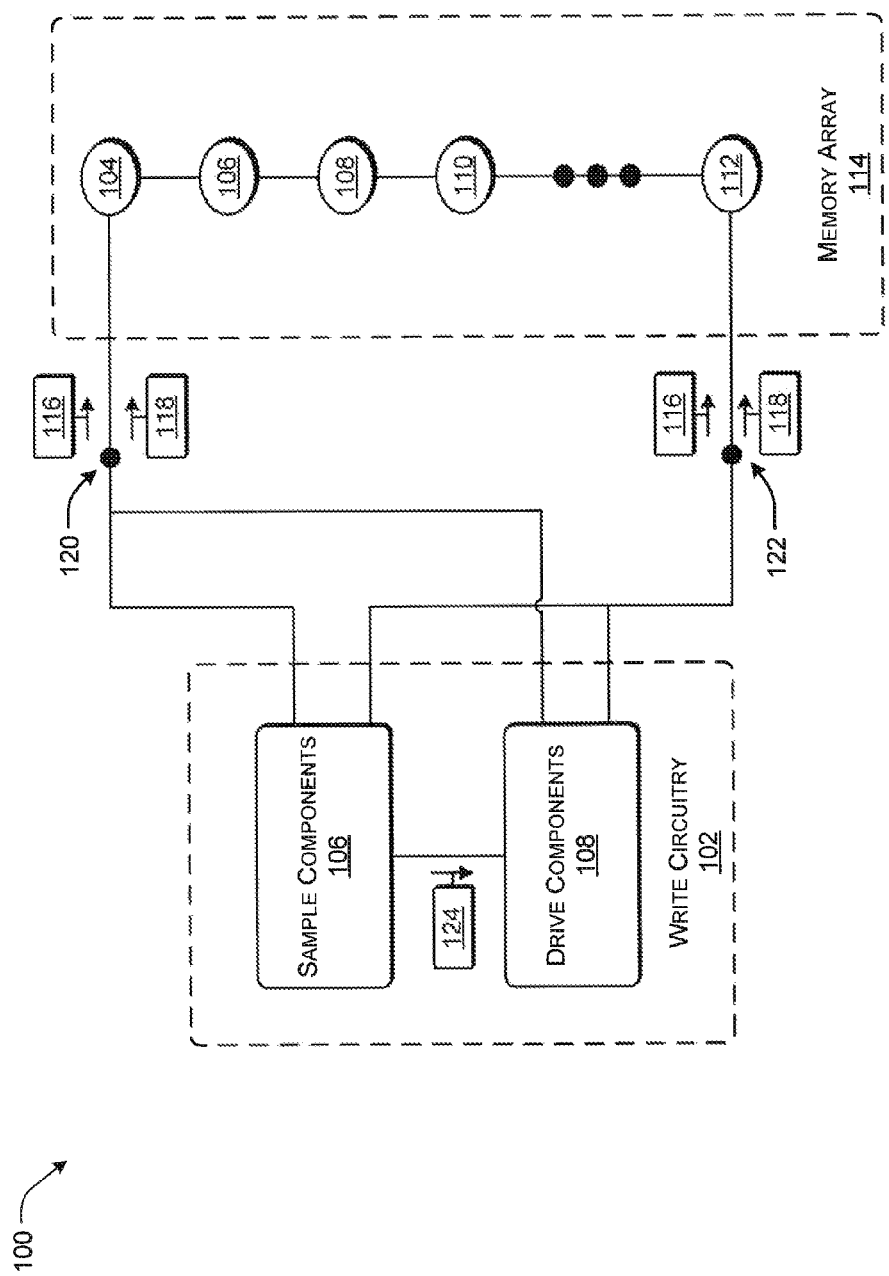
FIG. 1 illustrates an example block diagram of select components of a memory device according to some implementations.

This disclosure includes techniques and implementations to improve the reliability rate associated with accessing data stored in magnetic memory devices. For example, in some types of memory devices, such as magnetic memory devices, the data is stored by maintaining a desired state on a magnetic tunnel junction (MTJ) of a bit cell or a differential state between pairs of MTJs of two or more bit cells. The states of each bit cell of the memory device are typically set or switched by applying a voltage across a corresponding MTJ. Unfortunately, repeatedly applying voltages across the MTJs may, in some cases, lead to dielectric breakdown of the tunnel barrier, thereby rendering the bit cell unusable (e.g., the resistive state of the bit cell may become fixed) and reducing the reliability and usable lifetime of the memory device.

Additionally, the voltage required to switch or set each MTJ may fluctuate based on a natural variation in the resistance of each MTJ, as well as the resistive state of each MTJ. Unfortunately, in some devices, to ensure each bit cell switches correctly, the voltage used to set or switch the bit cells has a magnitude and/or duration greater than the magnitude and/or duration required to switch an MTJ with average resistance. Additionally, in some cases, when a bit cell is in a high resistive state, the voltage applied across the tunnel junction from the write pulse is increased compared to when the bit cell is in a low resistive state. Thus, for many of the MTJs, the voltage applied is of greater magnitude and/or length than necessary. By applying the over voltage, the power consumption associated with each write is increased, thereby increasing the overall power consumption of the device, while the MTJs experience accelerated breakdown of the tunnel barriers, thereby further reducing reliability of the memory device.

In some examples, the memory devices described herein may be configured to apply a write voltage to an array of bit cells via two array access points. For example, the memory device may apply the write voltage to a first array access point at one end of the bit cell array and to a second array access point at a second end opposite the first end of the bit cell array. In this manner, the MTJs of the bits cells are driven to a more consistent voltage level during an access operation, thereby reducing breakdown of the tunnel barriers and improving the endurance of the memory device. In some specific examples, each bit cell of the array may in some cases, act as either the first or second array access point, for instance, when only a portion of the bit cells of the bit cell array are being accessed.

In other examples, when select bit cells of the memory device are accessed, the memory device may be configured to apply a sample voltage over the select bit cells (or the associated bit cell array) while measuring a series resistance associated with the select bit cells at one or more array access points. In one example, the memory device may include a drive component to drive the sample voltage over the select bit cells via the first and second array access point. The memory device may also include a sample component to sample or measure the series resistance (e.g., the resistance associated with the select bit cells including the natural variation in the resistance of each of the select bit cells) between the first and second access points. The memory device may calculate a regulated write voltage based at least in part on the series resistance detected or measured by the sample component between the first and second array access point. For instance, the regulated write voltage may be set, based on the measured series resistance, at a level sufficient to switch each of the select bits but, below the level required to switch every bit cell of the memory device (or the level required to switch the bit cell having the largest resistive value).

In some particular examples, multiple iterations of the sample voltages may be applied to determine the regulated write voltage. For instance, a sample voltage may be applied, the resistance measured, and an updated sample voltage calculated, until the measured resistance is greater than a threshold resistance. In some cases, the regulated write voltage may be based at least in part on the measured resistance associated with each of the sample voltages, while in other cases; the regulated write voltage may be based on the resistance measured during the final sample voltage. In other cases, the sample voltage may be applied a predetermined number of times and the regulated write voltage may be based at least in part on the measured resistance associated with each of the sample voltages.

In some implementations, the first and second array access points may be associated with opposing ends of an individual bit cell. For instance, a series resistance may be measured for an individual bit cell, as the series resistance may vary based on the select devices, metal resistances (e.g., a source line metal resistance and/or a bit line metal resistance), transistor elements (e.g., a column select transistor), switches (e.g., a write driver switch), among others. In this implementation, the regulated write voltage applied to switch each bit cell may be tailored to the natural variation of the particular bit cell on a case-by-case basis.

In some cases, the memory device may determine or calculate the regulated write voltage during each access operation (or each write operation), for example, to determine the regulated write voltage based on the resistance of the select bit cells and/or to compensate for changes in the resistance of each bit cell over time. In other cases, the memory device may determine or calculate the regulated write voltage for each bit cell and store a value indicative of the regulated voltage for future use. In one particular case, the memory device may re-determine or re-calculate the regulated write voltage for each bit cell after a predetermined period of use elapses.

FIG. 1 illustrates an example block diagram of select components of a memory device 100 according to some implementations. In the illustrated example, the memory device 100 includes write circuity 102 configured to write data into bit cells, such as bit cells 104-112, of a memory array 114 in response to receiving a write command from an external source (not shown). In some implementations, the write circuitry 102 may be configured to apply a sample voltage or current 116, measure a resistance, configured a regulated write voltage or current 118 based on the measured resistance, and apply the regulated write voltage or current 118 to set the bit cells 104-112.

In some examples, the write circuitry 102 includes both sample components 106 and drive components 108 to write data to the memory array 114 for long-term storage. For example, the sample components 106 may include one or more sense amplifiers, isolation switches or devices, comparators, latches, among others. The drive components 108 may include one or more charge pumps, bias generators, preamplifiers, positive-channel metal oxide semiconductor (PMOS)-follower circuits, negative-channel metal oxide semiconductor (NMOS)-follower circuits, current source, voltage source, among others. In some implementations, the sample components 106 and the drive components 108 may share circuitry or components. In some cases duplicate or replica components or circuits may be incorporated into the sample components 106 and/or the drive components 108 to assist in measuring and/or estimating the resistance of the bit cells 104-112.

In the current example, the drive components 108 may be configured to apply a sample voltage or current 116 at a first array access point 120 and a second array access point 122 to drive the sample voltage or current 116 over the bit cells 104-112. The sample voltage or current 116 may be set to a level below a threshold known to cause one or more of the bit cells 104-112 of the memory array 114 to switch states. In other cases, the sample voltage or current 116 may be set to a level below a threshold known to cause each of the bit cells 104-112 to switch but above a level at which at least one of the bit cells 104-112 switch. For example, if the memory device is switching the state of bit cells 104-112, it may not be a concern if the sample voltage or current 116, rather than the regulated write voltage or current 118, switches one or more of the bit cells 104-112.

The sample components 106 may be configured to measure a series resistance of the bit cells 104-112, while the sample voltage or current 116 is applied by the drive components 108. For example, when a sample voltage 116 is applied, the sample components 106 may measure the current between the first array access point 120 and the second array access point 122 and translate the measured current into the series resistance or an indication of the series resistance. Similarly, when a sample current 116 is applied, the sample component 106 may measure the voltage between the first array access point 120 and the second array access point 122 and translate the measured voltage into the series resistance or an indication of the series resistance.

Once the series resistance or an indication of the series resistance is identified by the sample components 106, the sample components 106 provide an indicator 124 representative of the measured series resistance to the drive components 108. In some implementations, the indicator 124 may be a voltage level representative of the resistance. In one example, the sample components 106 may store the measured voltage or a voltage representative of the measured current on one or more capacitor or other storage components that may also be accessible to the drive components 108. For instance, the measured current may be translated into a voltage using a diode connected transistor (e.g., a gate and drain circuit).

The drive components 108 may generate the regulated write voltage or current 118 based at least in part on a value or level associated with the indicator 124. For example, the regulated write voltage 118 may be based in part on the stored voltage representative of the resistance and accessible to the drive components 108. In some cases, the drive components 108 may determine a regulated write current 118 by translating the stored voltage to a current and subtracting a predetermined current (for instance, a fixed current value based on a known maximum current level to switch each of the bit cells 104-112). In other cases, the drive components 108 may determine a regulated write current 118 by translating the stored voltage to a current and subtracting the predetermined current and then multiplying the resulting current by a second predetermined current. In still other cases, the drive components 108 may determine a regulated write voltage 118 by translating the stored voltage to a current and applying the current through one or more resistors. In yet other cases, the drive components 108 may comprise of two separate drive components. For example, the drive component 109 may include a first drive component (not shown) that drives a first predetermined voltage and a second drive component (not shown) that drives a second predetermined voltage. In one particular example, the second predetermined voltage may have a lower magnitude than the first predetermined voltage. Depending on the stored voltage representative of the resistance, the first predetermined voltage and/or second predetermined voltage may be applied by the drive components 108. For example, low resistance bit may be driven by the first predetermined voltage, whereas high resistance bit is driven by the second predetermined voltage.

The drive components 108 applies the regulated write voltage or current 118 at both the first array access point 120 and the second array access point 122 to write the bit cells 104-112. The regulated write voltage or current 118 is applied at both the first array access point 120 and the second array access point 122 to drive the bit cells 104-112 to a more consistent voltage, thereby reducing the rate at which the MTJs of the individual bit cells breakdown. In some cases, the regulated write voltage or current 118 may be applied via a current source. In some implementations, a magnitude of the regulated write current 118 may be equal to or similar to a desired voltage to switch the bit cells 104-112 divided by the difference between the measured resistance and an estimated resistance between the first array access point 120 and the second array access point 122. In other implementations, a magnitude of the regulated write voltage 118 may be equal to or similar to a desired voltage to switch the bit cells 104-112 times the measured resistance, divided by the difference between the measured resistance and an estimated resistance between the first array access point 120 and the second array access point 122.

It should be understood, that while the illustrated example shows five bit cells, the bit cells 104-112, between the first array access point 120 and the second array access point 122 any number of bit cells may be arranged between the first and second array access points 120 and 122 including as few as one individual bit cell. It should also be understood, that the measured resistance includes the resistive values of other components (not shown) of the memory device 100 in addition to the bit cells 104-112. For example, resistive values associated with devices used to select the bit cells 104-112, metal resistances of a source line and/or a bit line associated with the bit cells 104-112, transistor elements associated with, for instance, column select transistors, etc.

Figure 2:
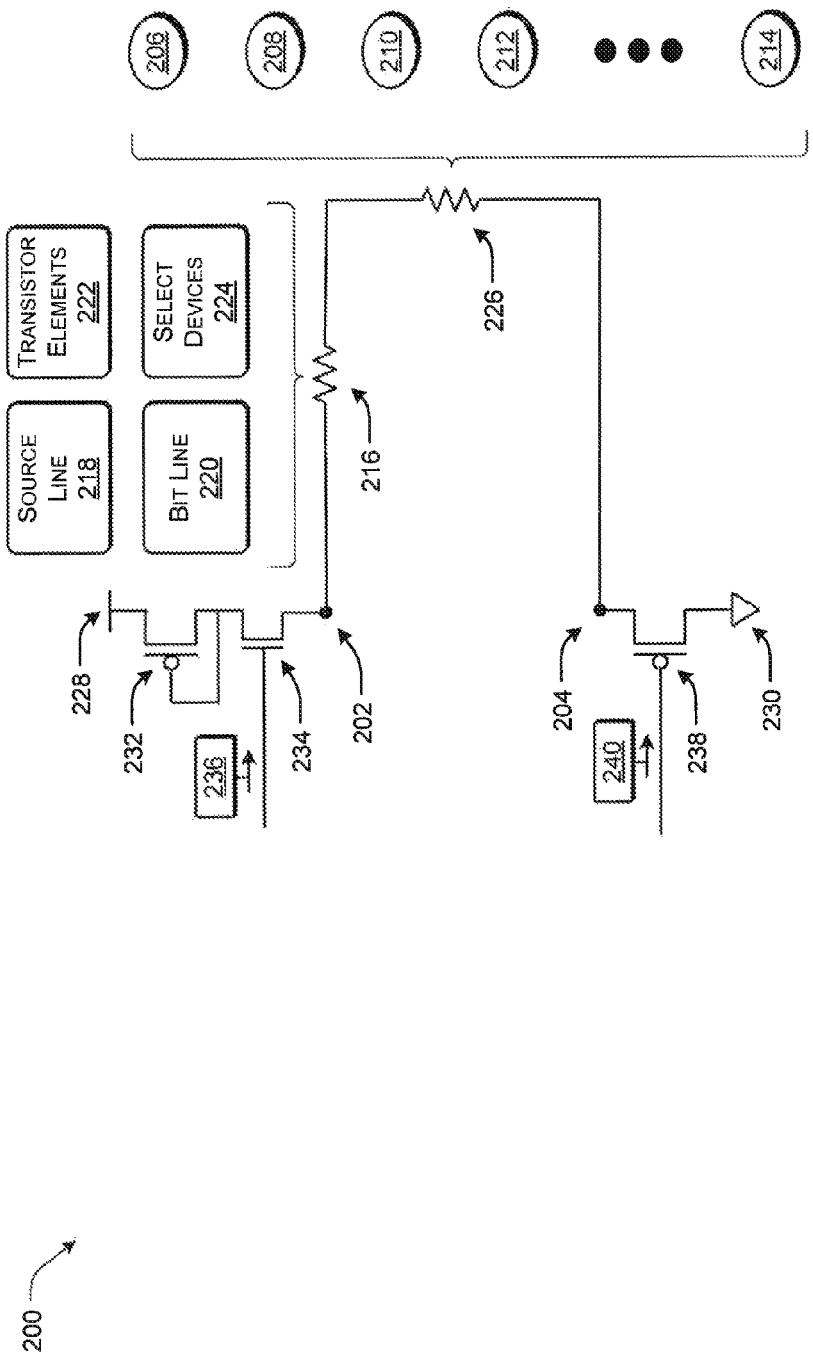
FIG. 2 illustrates an example circuit diagram of select components of a memory device according to some implementations.

FIG. 2 illustrates an example circuit diagram of select components of a memory device 200 according to some implementations. In the illustrated example, the memory device 200 is configured to apply the sample voltage or current, as well as the regulated write voltage or current at both a first array access point 202 and a second array access point 204. The memory device 200 may then measure the voltage or current differential between the first array access point 202 and the second array access point 204 to identify the resistance associated with the selected bit cells, illustrated as bit cells 206-214, and, thereby, determine a magnitude of the regulated write voltage or current.

In the current example, a first resistor 216 is illustrated and representative of the resistances associated with components of the memory device 200 between the first array access point 202 and the second array access point 204 other than the MTJs of the selected bit cells. For example, the first resistor 216 may represent the resistance associated with the metal of a source line 218 and/or a bit line 220, generally indicated by 218, associated with the bit cells 104-112, transistor elements 222, select devices 224, among others. A second resistor 226 is also illustrated between the first array access point 202 and the second array access point 204. The second resistor 226 may represent the resistances associated with the bit cells 206-214, such as the resistances associated with the MTJs of the bit cells 206-214.

The memory device 200 also includes a reference voltage 228 and a power supply 230 to assist in applying the sample voltage or current and/or the regulated write voltage or current to the first array access point 202 and the second array access point 204. In the illustrated implementation, the reference voltage 228 is coupled to a first electrode of a PMOS transistor 232. The PMOS transistor 232 also has a gate and a second electrode coupled to a first electrode of a NMOS transistor 234. The NMOS transistor 234 also has a gate for receiving a first control signal 236 and a second electrode coupled to the first array access point 202. The power supply 230 is coupled to a first electrode of a PMOS transistor 238. The PMOS transistor 238 has a gate for receiving a second control signal 240 and a second electrode coupled to the second array access point 204.

In the illustrated example, the NMOS transistor 234 and the PMOS transistor 238 are shown as coupled to the first and second array access points 202 and 204. However, it should be understood that, in some implementations, various select devices and components may be coupled between the NMOS transistor 236 and the first array access point 202. Likewise, in some implementations, various other select devices and components may be coupled between the PMOS transistor 240 and the second array access point 204 at allow the memory device 200 to access different groups of bit cells according to the data being written into the memory device 200.

In general, the first control signal 236 is transitioned to a high state and the second control signal 240 is transitioned to a low state to allow a sample voltage generated at least in part by the power source 230 and the voltage reference 228 to be applied at the first array access point 202 and the second array access point 204. For example, the sample voltage may be based at least in part on the current level of the voltage reference 228.

The memory device 200 may measure the voltage differential between the first array access point 202 and the second array access point 204, while the NMOS transistor 234 and the PMOS transistor 238 are enabled. For example, the measured voltage differential may be stored as a representative value of the combined resistance of the resistor 216 and the resistor 226. Once the voltage differential is identified, the first control signal 236 may transition to a low state and the second control signal 240 may transition to a high state to disable the sample voltage. The memory device 200 may also generate a regulated write voltage, for example, by altering the level of the reference voltage 228 while the NMOS transistor 234 and the PMOS transistor 238 are enabled.

Once the reference voltage 228 is altered, the first control signal 236 may again transition to a high state and the second control signal 240 may again transition to a low state to allow the regulated write voltage to be applied at the first array access point 202 and the second array access point 204. The regulated write voltage switches the state of the bit cells 206-214. In alternate embodiments, the PMOS transistor 238 may be replaced by an NMOS transistor (not shown) to pull down the second array access point 204 to reference voltage 230 when the NMOS transistor gate voltage is high.

Figure 3:
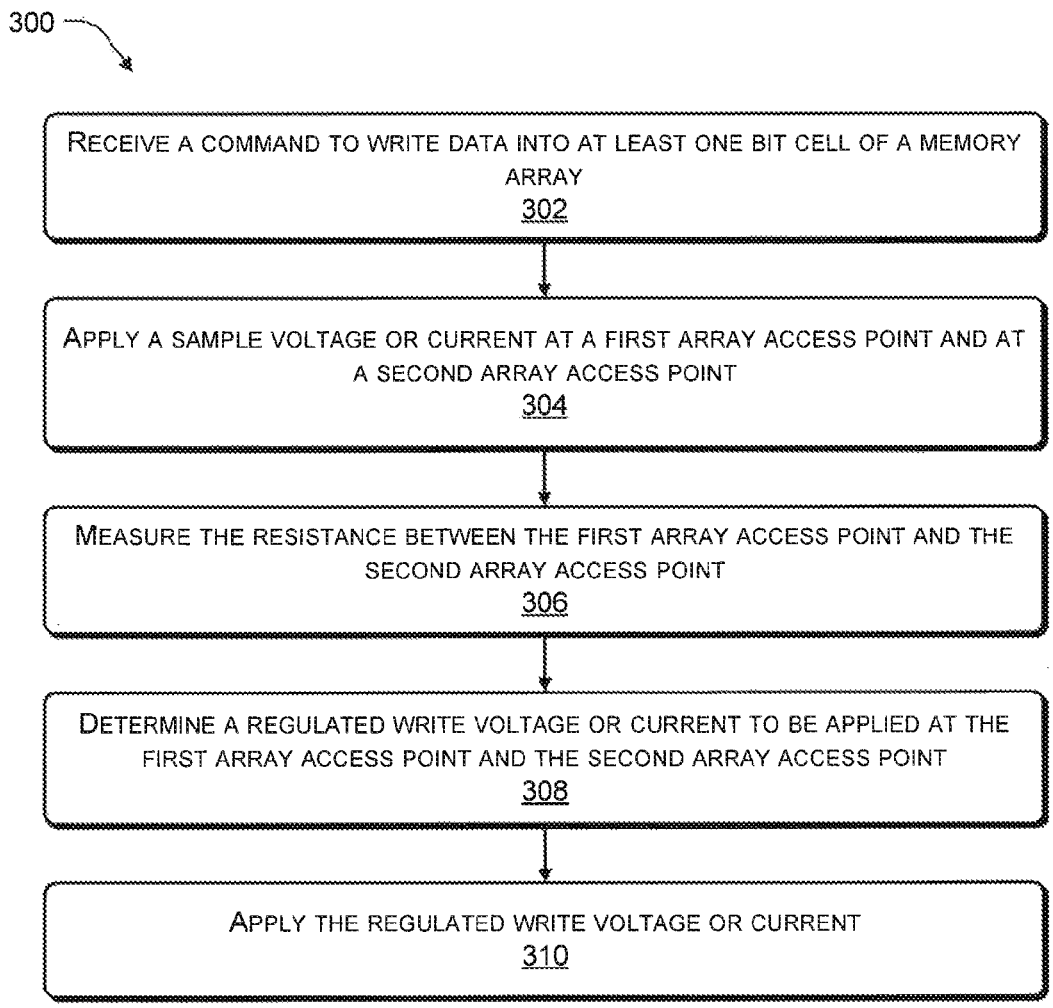
FIG. 3 illustrates an example flow diagram showing an illustrative process associated with writing data into an array of a memory device according to some implementations.
Figure 4:
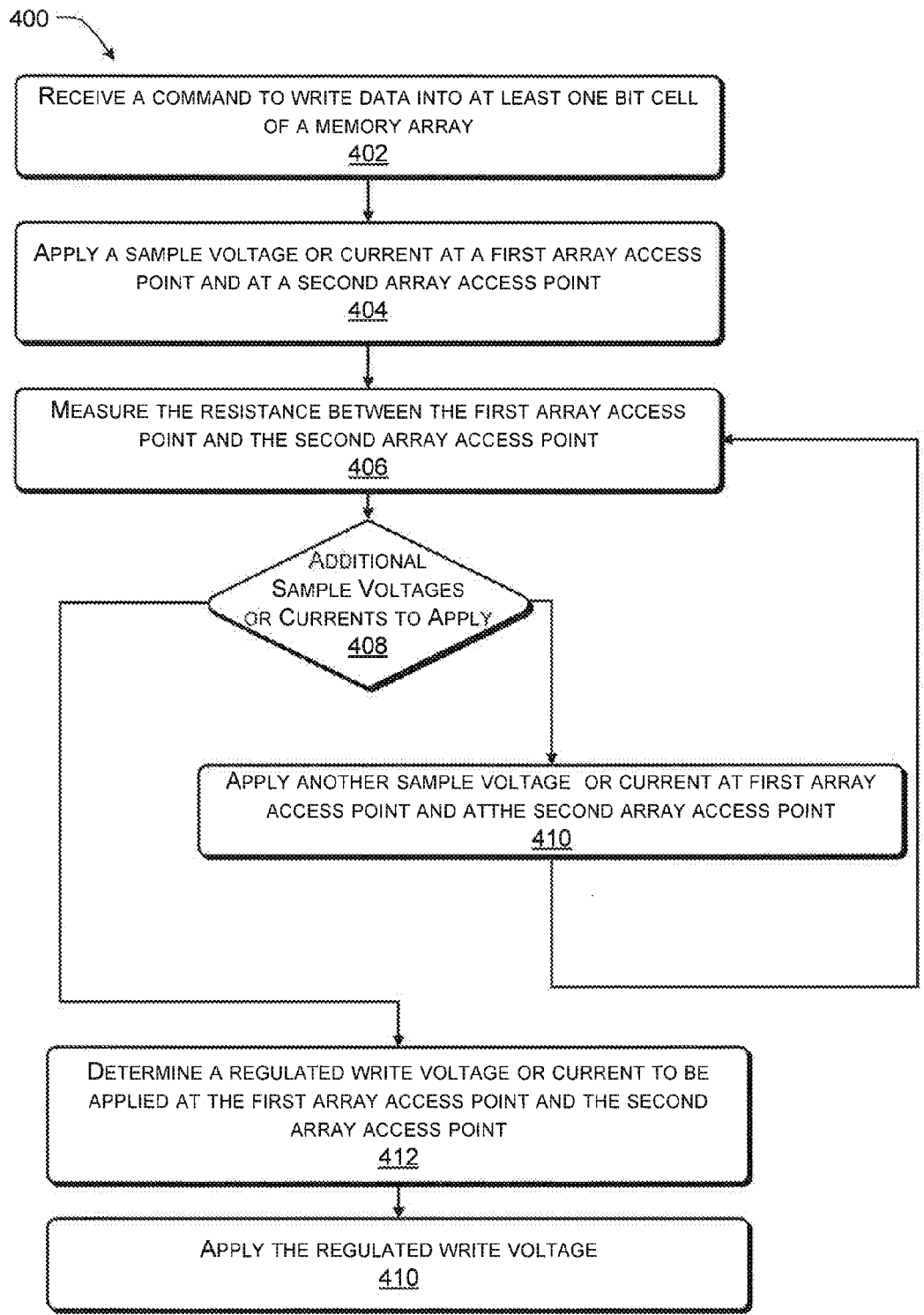
FIG. 4 illustrates another example flow diagram showing an illustrative process associated with writing data into an array of a memory device according to some implementations.
Figure 5:
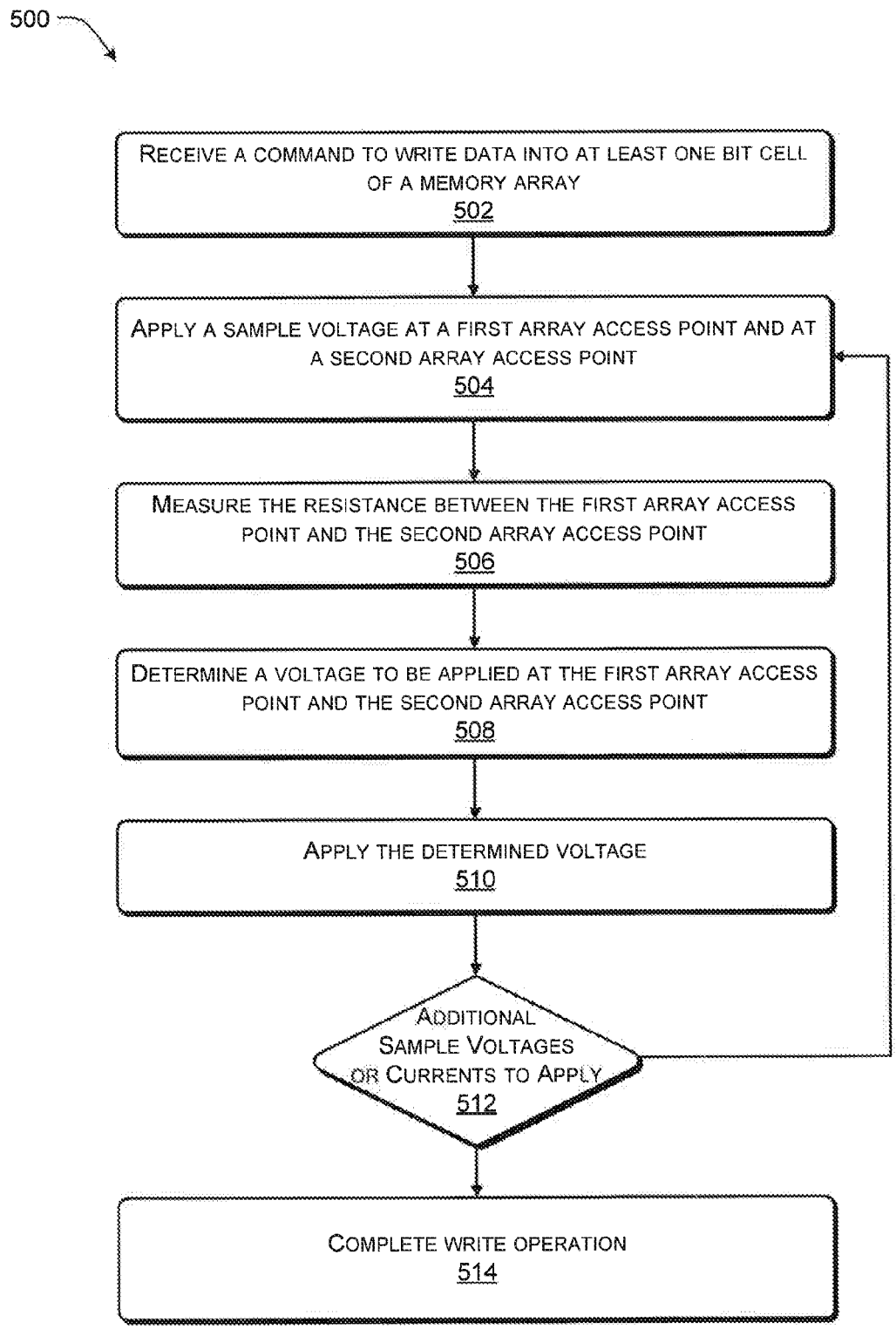
FIG. 5 illustrates another example flow diagram showing an illustrative process associated with writing data into an array of a memory device according to some implementations.

FIGS. 3-5 illustrate example processes performed by a memory device implementing the write sequences described above. The processes are illustrated as a collection of blocks in a logical flow diagram, which represents a sequence of operations, some or all of which can be implemented in hardware, software or a combination thereof.

The order in which the operations are described should not be construed as a limitation. Any number of the described blocks may be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 3 illustrates an example flow diagram showing an illustrative process 300 associated with writing data into a memory array of a memory device according to some implementations. At 302, a memory device receives a command to write data into at least one bit cell of the memory array. For example, the memory device may receive a write back command and/or a write command. In response, the memory device may access the data via one or more cache bits storing the data to be written into the memory array. In some examples, the memory device may receive a stream of data representative of the information to be stored in the memory array from an external source.

At 304, the memory device applies a sample voltage or current at a first array access point and at a second array access point. For example, the at least one bit cell to be written may be positioned between the first array access point and the second array access point such that the sample voltage may be driven over the at least one bit cell. In some cases, the sample voltage may be a sample current applied at the first array access point and at the second array access point.

At 306, the memory device measures the resistance between the first array access point and the second array access point. The measured resistance may include a resistive value associated with the MTJs of the at least one bit cell. In some cases, the measured resistance may also include a resistive value or series resistance associated with devices used to select the at least one bit cell, metal resistances of a source line and/or a bit line associated with the at least one bit cell, transistor elements associated the at least one bit cell, among others. In some examples, the memory device may determine the resistance by measuring the current between the first array access point and the second array access point while the sample voltage is applied and translate the measured current into the resistance or an indication of the resistance. In another example, the memory device may determine the resistance by measuring the voltage differential between the first array access point and the second array access point while a sample current is applied and translating the measured voltage into the resistance or an indication of the resistance.

At 308, the memory determines a regulated write voltage to be applied at the first array access point and the second array access point. For example, the regulated write voltage or current may be determined based at least in part on the measured resistance. For example, the regulated write voltage may be determined based in part on the stored voltage representative of the resistance and accessible to a drive component. In some cases, the memory device may determine the regulated write current by translating the stored voltage to a current and subtracting a predetermined current (for instance, a fixed current value based on a known maximum current level to switch each of the at least one bit cells). In other cases, the memory device may determine a regulated write current by translating the stored voltage to a current and subtracting the predetermined current and then multiplying the resulting current by a second predetermined current. In still other cases, the memory device may determine a regulated write voltage by translating the stored voltage to a current and applying the current through one or more resistors.

At 310, the memory device applies the regulated write voltage or current at the first array access point and at the second array access point. For example, the at least one bit cell to be written may be positioned between the first array access point and the second array access point such that the regulated write voltage may be driven over the at least one bit cell to cause each of the bit cells to switch states.

FIG. 4 illustrates another example flow diagram showing an illustrative process 400 associated with writing data into an array of a memory device according to some implementations. At 402, a memory device receives a command to write data into at least one bit cell of the memory array. For example, the memory device may receive a write back command and/or a write command. In response, the memory device may access the data via one or more cache bits storing the data to be written into the memory array. In some examples, the memory device may receive a stream of data representative of the information to be stored in the memory array from an external source.

At 404, the memory device applies a sample voltage or current at a first array access point and at a second array access point. For example, the at least one bit cell to be written may be positioned between the first array access point and the second array access point such that the sample voltage may be driven over the at least one bit cell. In some cases, the sample voltage may be a sample current applied at the first array access point and at the second array access point.

At 406, the memory device measures the resistance between the first array access point and the second array access point. The measured resistance may include a resistive value associated with the MTJs of the at least one bit cell. In some cases, the measured resistance may also include a resistive value or series resistance associated with devices used to select the at least one bit cell, metal resistances of a source line and/or a bit line associated with the at least one bit cell, transistor elements associated the at least one bit cell, among others. In some examples, the memory device may determine the resistance by measuring the current between the first array access point and the second array access point, while the sample voltage is applied and translate the measured current into the resistance or an indication of the resistance. In another example, the memory device may determine the resistance by measuring the voltage differential between the first array access point and the second array access point, while a sample current is applied and translating the measured voltage into the resistance or an indication of the resistance.

At 408, the memory device determines if there are additional sample voltages or currents to apply at the first and second array access points. For example, the memory device may compare the measured resistance to one or more thresholds to determine if another sample voltage or current of greater magnitude should be applied to more finely tune the regulated write voltage or current based on the particular bit cells selected as part of the write command. In other examples, the memory device may be configured to apply a predetermined number of sample voltages or currents at fixed magnitude and to utilize a resistance measurement associated with each sample voltage or current to determine the regulated write voltage or current.

If the memory device determines that additional sample voltages or currents should be applied, the process 400 proceeds to 410. At 410, the memory device applies the next sample voltage or current at the first array access point and the second array access point and returns to 406. Otherwise, the process 400 proceeds to 412 and the memory device determines the regulated write voltage or current to be applied at the first array access point and at the second array access point. For example, the regulated write voltage may be determined based in part on the stored voltage representative of the resistance and accessible to a drive component.

In some cases, the memory device may determine the regulated write current by translating the stored voltage to a current and subtracting a predetermined current (for instance, a fixed current value based on a known maximum current level to switch each of the at least one bit cells). In other cases, the memory device may determine a regulated write current by translating the stored voltage to a current and subtracting the predetermined current and then multiplying the resulting current by a second predetermined current. In still other cases, the memory device may determine a regulated write voltage by translating the stored voltage to a current and applying the current through one or more resistors.

At 410, the memory device applies the regulated write voltage or current at the first array access point and at the second array access point. For example, the at least one bit cell to be written may be positioned between the first array access point and the second array access point such that the regulated write voltage may be driven over the at least one bit cell to cause each of the bit cells to switch states.

FIG. 5 illustrates another example flow diagram showing an illustrative process 500 associated with writing data into an array of a memory device according to some implementations. At 502, a memory device receives a command to write data into at least one bit cell of the memory array. For example, the memory device may receive a write back command and/or a write command. In response, the memory device may access the data via one or more cache bits storing the data to be written into the memory array. In some examples, the memory device may receive a stream of data representative of the information to be stored in the memory array from an external source.

At 504, the memory device applies a sample voltage or current at a first array access point and at a second array access point. For example, the at least one bit cell to be written may be positioned between the first array access point and the second array access point such that the sample voltage may be driven over the at least one bit cell. In some cases, the sample voltage may be a sample current applied at the first array access point and at the second array access point.

At 506, the memory device measures the resistance between the first array access point and the second array access point. The measured resistance may include a resistive value associated with the MTJs of the at least one bit cell. In some cases, the measured resistance may also include a resistive value or series resistance associated with devices used to select the at least one bit cell, metal resistances of a source line and/or a bit line associated with the at least one bit cell, transistor elements associated the at least one bit cell, among others. In some examples, the memory device may determine the resistance by measuring the current between the first array access point and the second array access point, while the sample voltage is applied and translate the measured current into the resistance or an indication of the resistance. In another example, the memory device may determine the resistance by measuring the voltage differential between the first array access point and the second array access point, while a sample current is applied and translating the measured voltage into the resistance or an indication of the resistance.

At 508, the memory determines a voltage to be applied at the first array access point and the second array access point. For example, the voltage or current may be determined based at least in part on the measured resistance. For example, the voltage may be determined based in part on the stored voltage representative of the resistance and accessible to a drive component. In some cases, the memory device may determine the regulated write current by translating the stored voltage to a current and subtracting a predetermined current (for instance, a fixed current value based on a known maximum current level to switch each of the at least one bit cells). In other cases, the memory device may determine a current by translating the stored voltage to a current and subtracting the predetermined current and then multiplying the resulting current by a second predetermined current. In still other cases, the memory device may determine a voltage by translating the stored voltage to a current and applying the current through one or more resistors.

At 510, the memory device applies the voltage or current at the first array access point and at the second array access point. For example, the at least one bit cell to be written may be positioned between the first array access point and the second array access point such that the voltage may be driven over the at least one bit cell to cause each of the bit cells to switch states.

At 512, the memory device determines if there are additional sample voltages or currents to apply at the first and second array access points. For example, the memory device may compare the measured resistance to one or more thresholds to determine if another sample voltage or current of greater magnitude should be applied to more finely tune a regulated write voltage or current based on the particular bit cells selected as part of the write command. In other examples, the memory device may be configured to apply a predetermined number of sample voltages or currents at fixed magnitude and to utilize a resistance measurement associated with each sample voltage or current to determine the regulated write voltage or current.

If the memory device determines that additional sample voltages or currents should be applied, the process 500 proceeds to 514 and complete the write operation. Otherwise, the process 500 proceeds to 504 and the memory device applies another sample voltage at the first array access point and the second array access point.

Figure 6:
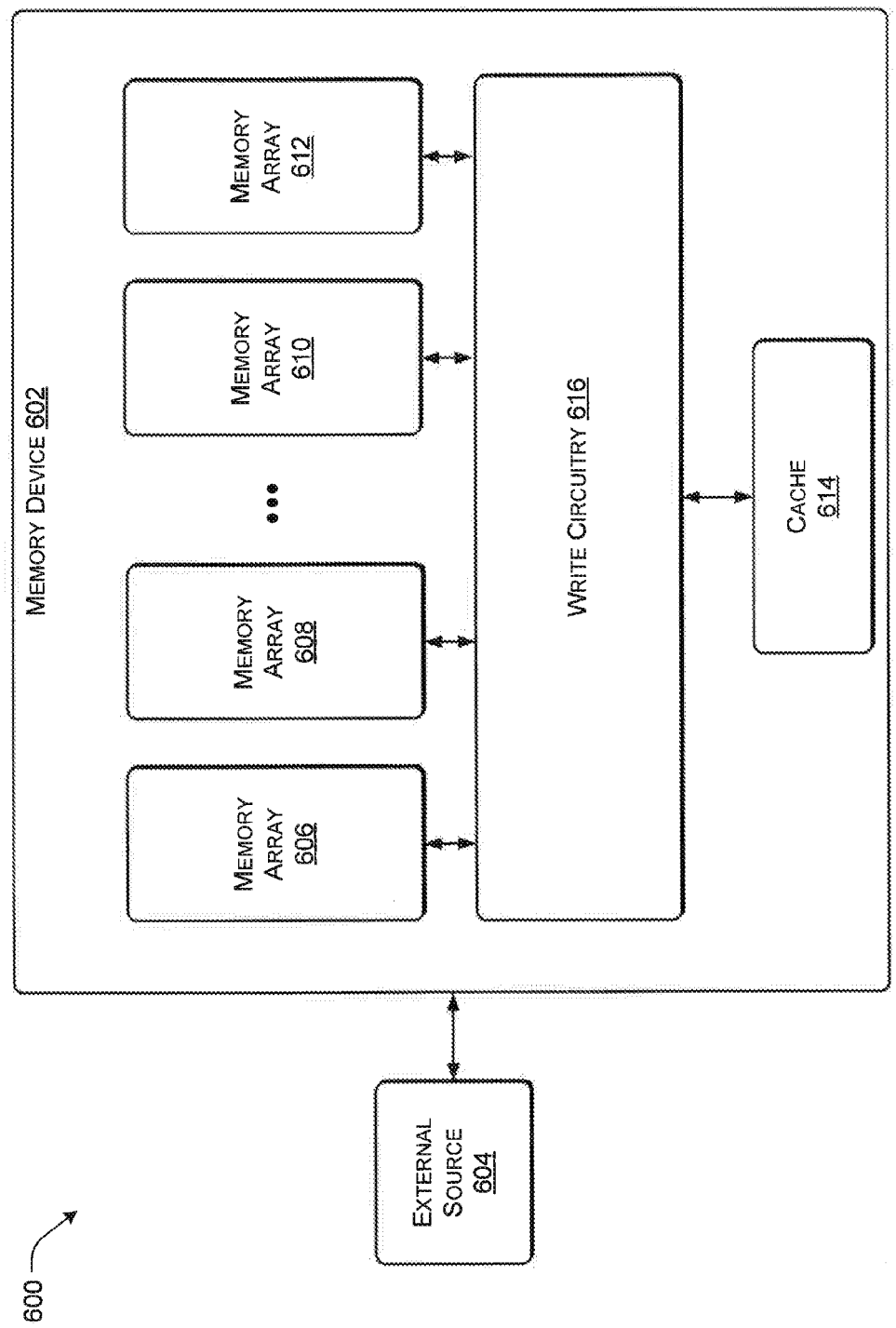
FIG. 6 illustrates an example block diagram of select components of a memory device accessible to an external source according to some implementations.

FIG. 6 illustrates an example block diagram 600 of select components of a memory device 602 accessible to an external source 604. In the illustrated example, the memory device 602 includes memory arrays 606-612, as well as cache 614 and write circuitry 616. In general, the write circuitry 616 may be configured to write data stored in the cache 614 into bit cells of the corresponding memory array 606-612 in response to receiving a precharge command and/or a write command from the external source 604.

The memory device 602 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, RAID storage systems, storage arrays, network attached storage, storage area networks, cloud storage, or any other medium that can be used to store information. In one particular example, the memory device may be a magnetic memory or magnetic disk storage, such as an MRAM device.

In general, the write circuitry 616 is configured to apply at least one sample voltage or current to a first array access point and a second array access point of at least one of the memory arrays 606-612 to write data into select bit cells of the memory arrays 606-612. In some cases, the first array access point and the second array access point may be associated with a single memory array 606-612, as described above. However, in other cases, the first array access point and the second array access point may be associated with different memory arrays 606-612. For example, the first array access point may be associated with the memory array 606 and the second array access point associated with the memory array 608.

In some implementations, the write circuitry 616 may measure a series resistance between the first array access point and the second array access point while the sample voltage or current is applied. For instance, the write circuitry 616 may determine the resistance by measuring the current between the first array access point and the second array access point, while the sample voltage is applied and translating the measured current into the resistance or an indication of the resistance. In another example, write circuitry 616 may determine the resistance by measuring the voltage differential between the first array access point and the second array access point, while a sample current is applied and translating the measured voltage into the resistance or an indication of the resistance.

The write circuitry 616 may determine or generate a regulated write voltage or current based at least in part on the measured resistance. For example, the regulated write voltage may be determined based in part on the stored voltage representative of the resistance and accessible to a drive component. In some cases, the memory device may determine the regulated write current by translating the stored voltage to a current and subtracting a predetermined current (for instance, a fixed current value based on a known maximum current level to switch each of the at least one bit cells). In other cases, the memory device may determine a regulated write current by translating the stored voltage to a current and subtracting the predetermined current and then multiplying the resulting current by a second predetermined current. In still other cases, the memory device may determine a regulated write voltage by translating the stored voltage to a current and applying the current through one or more resistors. The write circuitry 616 then applies the regulated write voltage or current at the first array access point and at the second array access point to switch the selected bit cells.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A memory device comprising:
   a memory array having a bit cell;
   write circuitry coupled to the memory array at a first array access point and a second array access point, the write circuitry configured to:
   apply a sample signal at the first array access point and at the second array access point, the sample signal of a magnitude of less than a magnitude to switch a state of the bit cell;
   identify a resistive value associated with the bit cell and the sample signal;
   determine a magnitude of a regulated write signal based in part on the resistive value, the magnitude of the regulated write signal greater than the magnitude to switch the state of the bit cell; and
   apply the regulated write signal at the first array access point and at the second array access point.

2. The memory device as recited in claim 1, wherein the sample signal is at least one of: a sample voltage or a sample current and the regulated write signal is at least one of a regulated write voltage or a regulated write current.

3. The memory device as recited in claim 1, wherein identifying the resistive value includes:
   measuring, while the sample signal is applied, a current at the first array access point and at the second array access point; and
   translating the current into the resistive value.

4. The memory device as recited in claim 1, wherein identifying the resistive value includes:
   measuring a voltage differential between the first array access point and the second array access point, while the sample signal is applied; and
   translating the voltage differential into the resistive value.

5. The memory device as recited in claim 1, wherein the write circuitry includes:
   a drive component for applying the sample signal and the regulated write signal; and
   a sample component for identifying the resistive value.

6. The memory device as recited in claim 1, wherein the first array access point and the second array access point are associated with the bit cell to allow the sample signal the regulated write signal to be applied to the bit cell and prevent the sample signal the regulated write signal from being applied to other bit cells of the memory array.

7. The memory device as recited in claim 1, wherein the first array access point and the second array access point are associated with the bit cell and at least a second bit cell of the memory array.

8. A method comprising:
   applying, by a drive component of a memory device, a sample voltage at a first array access point and at a second array access point, the first array access point and the second array access point selected based at least in part on a particular bit cell of a plurality of bit cells being accessed, a magnitude of the sample voltage set to a level below a threshold known to cause each of the plurality of bit cells to switch states;
   sampling, by a sample component of the memory device, a resistance between the first array access point and the second array access point while the drive component applies the sample voltage;
   determining, by the drive component, a magnitude of a regulated write signal based in part on the resistance prior to applying a signal to cause a state of the particular bit cell to switch; and
   applying, by the drive component, the regulated write signal at the first array access point and at the second array access point to cause the state of the particular bit cell to switch.

9. The method as recited in claim 8, further comprising receiving, at the memory device, data to be written to the particular bit cell.

10. The method as recited in claim 8, wherein determining the magnitude of the regulated write signal based in part on the resistance includes:
    determining a regulated write current by translating a stored voltage representative of the resistance to a current; and
    subtracting a predetermined amount from the current.

11. The method as recited in claim 8, wherein determining the magnitude of the regulated write signal based in part on the resistance includes:

determining a regulated write current by translating a stored voltage representative of the resistance to a current;

subtracting the predetermined amount from the current to generate a resulting current; and multiplying the resulting current by a second predetermined amount.

12. The method as recited in claim 8, wherein determining the magnitude of the regulated write signal based in part on the resistance includes:

determining a regulated write voltage by translating a stored voltage to a current representative of the resistance; and driving the current through one or more resistors of the particular bit cells to a predetermined state prior to applying the first voltage.

13. The method as recited in claim 8, further comprising:

applying, by the drive component, a second sample voltage at the first array access point and at the second array access point, the second sample voltage having a magnitude greater than a magnitude of the first sample voltage;

sampling, by the sample component, a second resistance between the first array access point and the second array access point while the drive component applies the second sample voltage; and wherein the magnitude of the regulated write signal is further based in part on the second resistance.

14. The method as recited in claim 8, further comprising providing an indication of the resistance from the sample component to the drive component.

15. A method comprising:

sampling a resistance between a first array access point and a second array access point while a sample signal is applied at the first array access point and the second array access point, a magnitude of the sample signal less than a first magnitude known to switch a state of a bit cell of a memory array associated with the first array access point and the second array access point;

determining a second magnitude of a regulated write signal based in part on the resistance; and applying the regulated write signal at the first array access point and at the second array access point.

16. The method as recited in claim 15, wherein the sample signal is a sample voltage.

17. The method as recited in claim 15, wherein the sample signal is a sample current.

18. The method as recited in claim 15, further comprising:

sampling a second resistance between the first array access point and the second array access point while a second sample voltage is applied at the first array access point and the second array access point; and wherein the second magnitude of the regulated write signal is further based in part on the second resistance.

19. The method as recited in claim 15, the first magnitude is less than a level that would cause each bit cell of the memory array to switch states.

20. The memory device as recited in claim 1, wherein the write circuitry identifies the resistive value associated with the bit cell and the sample signal prior to causing the state of the bit cell to switch.

* * * * *